(12) United States Patent
Smith

(10) Patent No.: US 9,911,077 B2
(45) Date of Patent: Mar. 6, 2018

(54) PERSISTENT NODES FOR RFID

(71) Applicant: Ruizhang Technology Limited Company, Shanghai (CN)

(72) Inventor: John Stephen Smith, San Jose, CA (US)

(73) Assignee: Ruizhang Technology Limited Company, Shanghai (CN)

( * ) Notice: Subject to any disclaimer, the term of this patent is extended or adjusted under 35 U.S.C. 154(b) by 0 days.

(21) Appl. No.: 15/413,294

(22) Filed: Jan. 23, 2017

(65) Prior Publication Data

US 2017/0185882 A1     Jun. 29, 2017

Related U.S. Application Data

(60) Division of application No. 14/927,435, filed on Oct. 29, 2015, now Pat. No. 9,552,540, which is a continuation of application No. 14/497,241, filed on Sep. 25, 2014, now Pat. No. 9,183,481, which is a division of application No. 13/355,422, filed on Jan. 20, 2012, now Pat. No. 8,844,830.

(51) Int. Cl.
| | |
|---|---|
| G06K 19/06 | (2006.01) |
| G06K 19/073 | (2006.01) |
| G06K 19/07 | (2006.01) |
| H03K 3/0233 | (2006.01) |

(52) U.S. Cl.
CPC ....... *G06K 19/073* (2013.01); *G06K 19/0715* (2013.01); *G06K 19/0723* (2013.01); *H03K 3/0233* (2013.01)

(58) Field of Classification Search
CPC .................. G09K 19/07749; G09K 19/0775
USPC .................. 235/492, 451, 462.46, 472.022
See application file for complete search history.

(56) References Cited

U.S. PATENT DOCUMENTS

| | | |
|---|---|---|
| 6,942,155 B1 | 9/2005 | Stewart et al. |
| 7,083,104 B1 | 8/2006 | Empedocles et al. |
| 7,116,240 B2 | 10/2006 | Hyde |
| 7,215,251 B2 | 5/2007 | Hyde |
| 7,259,654 B2 | 8/2007 | Littlechild et al. |
| 7,284,703 B2 | 10/2007 | Powell et al. |
| 7,364,084 B2 | 4/2008 | Stewart et al. |
| 7,377,445 B1 | 5/2008 | Stewart et al. |
| 7,679,945 B2 | 3/2010 | Rizzo et al. |
| 7,710,798 B2 | 5/2010 | Pillai |
| 7,728,713 B2 | 6/2010 | Stewart |
| 7,737,825 B1 | 6/2010 | Stewart et al. |

(Continued)

OTHER PUBLICATIONS

Lee, Wen-Chin and Hu, Chenming. "Modeling CMOS Tunneling Currents Through Ultrathin Gate Oxide Due to Conduction- and Valence-Band Electron and Hole Tunneling," IEEE Transactions on Electron Devices, vol. 48, No. 7 (Jul. 2001), pp. 1366-1373.

*Primary Examiner* — Daniel St Cyr
(74) *Attorney, Agent, or Firm* — Womble Bond Dickinson (US) LLP

(57) ABSTRACT

An RFID transponder in one embodiment comprises a radio frequency (RF) transceiver, processing logic coupled to the RF transceiver, a switch coupled to the processing logic, a tunneling device coupled to the switch and a differential sensing circuit having a first input coupled to the tunneling device and a second input coupled to a predetermined reference voltage. In one embodiment, the tunneling device can discharge to a voltage below the predetermined reference voltage.

9 Claims, 9 Drawing Sheets

(56) References Cited

U.S. PATENT DOCUMENTS

| | | |
|---|---|---|
| 7,920,064 B2 | 4/2011 | Kang et al. |
| 8,261,999 B2 | 9/2012 | Ikeda et al. |
| 8,292,175 B2 | 10/2012 | Kim |
| 8,313,034 B2 | 11/2012 | Okuda |
| 8,395,505 B2 | 3/2013 | Hadley et al. |
| 8,453,936 B2 | 6/2013 | Johnson et al. |
| 8,844,830 B2 * | 9/2014 | Smith ................ G06K 19/0715 235/462.46 |
| 2011/0032027 A1 * | 2/2011 | Dash ........................ G05F 1/56 327/539 |

* cited by examiner

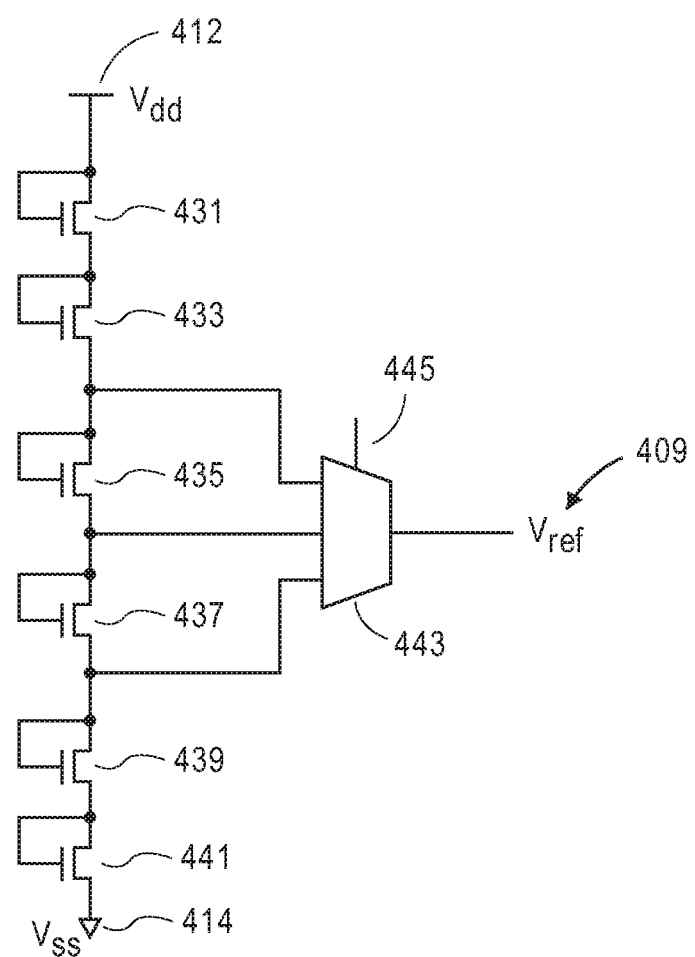

PERSISTENT NODES FOR RFID

This application is a divisional of U.S. patent application Ser. No. 14/927,435, filed on Oct. 29, 2015, now issued as U.S. Pat. No. 9,552,540, which is a continuation of U.S. patent application Ser. No. 14/497,241, filed on Sep. 25, 2014, now issued as U.S. Pat. No. 9,183,481, which is a divisional of U.S. patent application Ser. No. 13/355,422, filed on Jan. 20, 2012, now issued as U.S. Pat. No. 8,844,830.

BACKGROUND OF THE INVENTION

The present invention relates generally to the field of radio frequency identification (RFID) devices or tags and specifically to RFID devices which include one or more persistent nodes.

RFID transponders (commonly referred to herein as "tags") in the form of labels, inlays, straps or other forms are widely used to associate an object with an identification code. Tags generally include one or more antennas with analog and/or digital electronic circuits that include communications electronics (such as an RF transceiver), data memory (for storing one or more identification codes), processing logic (such as a microcontroller) and one or more state storage devices. Examples of applications that can use RFID tags include luggage tracking, inventory control or tracking (such as in a warehouse), parcel tracking, access control to buildings or vehicles, etc.

There are three basic types of RFID tags. A passive tag is a beam powered device which rectifies energy required for operation from radio waves generated by a reader. For communication, the passive tag creates a change in reflectivity of the field which is reflected to and read by the reader. This is commonly referred to as continuous wave backscattering. A battery-powered semi-passive tag also receives and reflects radio waves from the reader; however a battery powers the tag independent of receiving power from the reader. An active tag, having an independent power supply, includes its own radio frequency source for transmission.

The reader, sometimes referred to as an interrogator, includes a transmitter to transmit RF signals to the tag and a receiver to receive tag modulated information. The transmitter and receiver can be combined as a transceiver which can use one or more antennas. Communications between a reader and tag is defined by an air interface protocol, such as (without limitation):

(i) EPCglobal's EPC Radio-Frequency Identity Protocols Class-1 Generation-2 UHF RFID Protocol for Communications at 860 MHz-960 MHz, version 1.2.0 (http://www.epcglobalinc.org/) (hereinafter referred to as the "UHF Gen2 standard");

(ii) adaptations of the UHF Gen2 standard for operation at high frequency ("HF"), for example at 13.56 MHz; and (iii) ISO/IEC 18000-6 Information technology-Radio frequency identification for item management-Part 6: Parameters for air interface communications at 860 MHz to 960 MHz, Amendment 1: Extension with Type C and update of Types A and B. Each of the above protocols is incorporated herein by reference for all purposes.

Communication protocols, such as these, may require that a passive tag operate a timing circuit or maintain a flag value during a brief lapse of received power which can occur when a reader hops between transmission frequencies. For example, the UHF Gen2 standard requires persistence for flags SL, S1, S2, and S3, but not S0. U.S. Pat. No. 6,942,155 and pending U.S. application Ser. No. 12/420,009, filed Apr. 7, 2009, both assigned to Alien Technology Corporation ("Alien," also the assignee to this invention) and incorporated by reference herein for all purposes, provide various teachings on persistent flags and nodes. Other or related techniques have been suggested by the following patents (each of which is incorporated by reference herein for all purposes): U.S. Pat. No. 7,259,654; U.S. Pat. No. 7,710,798; and U.S. Pat. No. 7,215,251.

It should be clear from the teachings herein that a persistent flag is a bit, character(s), or other indicator that signals the occurrence of some condition. The persistent flag can be stored in a persistent node that provides a state storage device. The persistent node is a circuit which is initialized to a value, and the value read from the persistent node can change at some later time. Persistent flags can be implemented using persistent nodes as described in one or more of the incorporated references. As an example, persistent flags can be implemented essentially as a timer using persistent nodes. For example in the ISO/IEC 18000-6c specification, each flag has one of two values. "A" or "B" for the S1, S2 or S3 flags, and "asserted" or "deasserted" for the SL flag.

Passive RFID tags can lose power whenever a reader is turned off for a period of time that is longer than the tag can support supplying current from its power capacitor(s). Currently known methods of implementing a state storage bit or flag in a state storage device include the use of an FET (Field Effect Transistor) to charge/discharge a capacitor so that the leakage through the FET in the off state determines the discharge time for the state storage bit. Since the high impedance of the FET (in the off state) depends on parasitics, when the power supply is off (e.g., the reader stops transmitting), the state storage device dissipates its charge by means of an unknown and widely varying leakage current. As a result, these implementations can cause the capacitor to drain current too quickly or allow the capacitor to retain a charge for too long. Hence, in these implementations, the state storage time can vary with ambient temperature (e.g. tags in a cold warehouse vs. tags in a hot warehouse will have different state storage times) and can vary due to processing variations (from variations in processing operations in the semiconductor wafer and IC fabrication process), and this variation can be from a few seconds to a few hours. A known method of reducing the variation of the current discharging device is the use of a calibration method to keep a FET transistor gate bias blocking the discharge of the capacitor at a voltage which gives a substantially constant current; another known method to reduce this variation is to trim the devices to minimize process variations. These known methods either result in significant variation in the timing of the circuit or substantial additional cost due to additional semiconductor IC fabrication processing or additional circuit area to provide calibration circuits.

FIG. 1 shows an example in the prior art which uses a thin oxide capacitor as a state storage device for an RFID tag. The state storage device 11 in FIG. 1 includes an n-channel FET 12 having its drain coupled to a supply voltage $V_{dd}$ (or to another charging or discharging node which supplies a voltage derived from a voltage source) and its gate 14 coupled to processing logic (not shown) to either charge or not charge the capacitors 15 and 16 which are coupled, at node 19, to the source of FET 12. The capacitors 15 and 16 are also coupled to $V_{ss}$ (which can be ground). The FET 12 acts as a switch, which is controlled by the signal applied to gate 14, to either charge or not charge the capacitors 15 and 16. Capacitor 16 is a thin gate oxide capacitor which supplies the majority of the capacitance due to its thin dielectric, and also allows current through the dielectric due to tunneling; the capacitor 16 is disposed in the substrate of a semiconductor IC (integrated circuit) that includes the state storage device 11. Capacitor 15 is a capacitor fabricated in the metal and insulator layers above the substrate and hence capacitor 15 is referred to as a metal-insulator-metal (MIM) capacitor. The capacitance of capacitor 16 exceeds the capacitance of capacitor 15. Node 19 can be considered the output of the state of the state storage device 11, and this output is coupled to one input of a balanced sense amp 18 that also receives an input from a set of capacitors 15A and 16A that are fabricated to match identically capacitors 15 and 16. Capacitors 15A and 16A remain at a fully discharged state, and the balanced sense amp 18 determines whether the output at node 19 exceeds the fully discharged state of capacitors 15A and 16A. The balanced sense amp 18 is implemented as a current mirroring circuit that flips an output one way or the other way depending upon whether the node 19 exceeds the fully discharged state of capacitors 15A and 16A. The balanced sense amp allows discharge to a very low level, and the time to discharge of the node depends on the total capacitance of capacitors 15 and 16, the semiconductor leakage through the FET 12 at high temperatures, and the leakage through the oxide of cap 16 at low temperatures. The time to discharge varies from below 1 second at high temperatures, limited by leakage through FET 12, and over 120 seconds at low temperatures, limited by the leakage of cap 16. The process variation is also approximately a factor of 5, due to the discharge to very low level, maintaining an adequate persistent node duration.

SUMMARY OF THE DESCRIPTION

In one embodiment, a state storage device of the present invention provides a persistent node with good behavior over semiconductor fabrication process variations and over changes in temperature, and this good behavior is obtained at a lower cost due to the smaller size of the circuit and without any expensive trimming as in the prior art.

In one embodiment, an RFID tag can include a state storage device which comprises a switch coupled to processing logic and a tunneling device coupled to the switch and to a differential sensing circuit which has a first input coupled to the tunneling device and a second input coupled to a predetermined reference voltage. The discharge time of the tunneling device is set to be determined by a tunneling current. An example tunneling device useful for this purpose is a thin silicon dioxide layer with a thickness between 10 angstroms and 50 angstroms. An example of a tunneling device is a gate oxide layer of a low voltage CMOS process. The gate oxide layer is one of the most tightly constrained and controlled parameters in semiconductor fabrication processing and hence the tunneling current can be accurately controlled using current semiconductor fabrication processing techniques. The tunneling current is not substantially constant but varies with the voltage on the structure. Modeling CMOS Tunneling Currents Through Ultrathin Gate Oxide Due to Conduction- and Valence-Band Electron and Hole Tunneling Wen-Chin Lee, Member, IEEE, and Chenming Hu, Fellow, IEEE. IEEE TRANSACTIONS ON ELECTRON DEVICES, VOL. 48, NO. 7, JULY 2001.

The discharge time of the tunneling device can be designed by selecting the size of the capacitor, the size of the tunneling device, the starting voltage and the terminal voltage which can be the predetermined reference voltage. The switch leakage current is made negligible in comparison to the tunneling current by the use of a very low leakage switch such as a very long gate MOS device. Since the tunneling current can be relatively independent of ambient temperature and since the oxide thickness or gate oxide thickness is generally tightly controlled, this embodiment results in a high performing, relatively inexpensive solution for a persistent node or state storage device which can continue timing with or without power being provided to the RFID transponder. In one embodiment, the predetermined reference voltage can be set to a value which is above the fully discharged voltage of the tunneling device by reducing the discharge current to an extremely low but predictable current provided by the tunneling device, and the predetermined reference voltage can be provided by a reference voltage generator which does not need to be very low, not needing to be measured against a balanced device, and that does not require include any tunneling devices. The switch, in one embodiment, can be an FET made with a channel long enough to make the leakage current through the FET negligible.

An RFID transponder, in one embodiment, can include an RF (Radio Frequency) transceiver which includes both a transmitter and a receiver coupled to one or more antennas, and processing logic coupled to the RF transceiver, and a first switch coupled to a first reference voltage, and a capacitor coupled to the switch and a tunneling device coupled to the switch and coupled in parallel with the capacitor. The RFID transponder also includes a differential sensing circuit coupled, at a first node, to the capacitor and to the tunneling device. The first node is a charge storage node. The differential sensing circuit determines whether a voltage at the first node is above a predetermined reference voltage which can be generated by a reference voltage generator that in one embodiment does not include any tunneling devices. Moreover, the predetermined reference voltage can be above the fully discharged voltage of the tunneling device capacitor in the state storage device. The differential sensing circuit indicates a first state when the voltage at the first node is above the predetermined reference voltage and indicates a second state when the voltage at the first node is below the predetermined reference voltage. The switch can be coupled to the processing logic in order to determine when and whether the capacitors are charged in a manner which is consistent with the known protocols such as the EPC protocol or the ISO/IEC specification referred to herein.

The tunneling device can include a thin gate oxide which separates a first gate of the tunneling device from a first substrate region in a substrate of a semiconductor integrated circuit. The capacitor can also be disposed in the substrate and include a thick gate oxide which separates a second gate from a second substrate region in the substrate of the semiconductor integrated circuit, wherein the second gate and the second substrate region act as plates of the capacitor. The tunneling device and the capacitor can discharge through a range of voltages that is defined by the first reference voltage at one end of the range and by the predetermined reference voltage, which can be above a ground voltage and the tunneling device and the capacitor can continue to discharge to voltages below the predetermined reference voltage.

The predetermined reference voltage can be generated by a reference voltage generator which is coupled to the first reference voltage and to a ground voltage and which is coupled to the sensing circuit; in one embodiment, the reference voltage generator does not include any tunneling capacitors and hence generates the predetermined reference voltage independently of the operation of a tunneling capacitor. In one embodiment, the capacitor has a substantially greater area than the tunneling device. In one embodiment, the capacitor has a substantially greater capacitance than the tunneling device. In one embodiment, the tunneling device is a thin oxide capacitor which has a substantially smaller area than the capacitor. In one embodiment, the tunneling device is a thin oxide capacitor which has a substantially smaller capacitance than the capacitor. The switch can be coupled to the processing logic and can include a field effect transistor which selectively charges the capacitor and the tunneling device. In one embodiment, the majority of the discharge of the capacitor is through a tunneling current through the thin gate oxide and the field effect transistor in the switch has a long channel length to make the leakage current through the field effect transistor negligible over the operating temperature range. In one embodiment, the operating temperature range is from −25 to +40 degrees Celsius. In one embodiment, the operating temperature range is from −25 to +85 degrees Celsius.

The state of charge of the capacitance of the current invention forms a timer which continues to work during a loss of power in the RFID transponder. The timer can store a flag state for a predetermined period of time which can be substantially independent of ambient temperature. For example, the predetermined period of time provided by the invention can be substantially independent of changes in temperature from −25 to +40° C. The predetermined period of time can be more than 0.5 seconds and less than 120 seconds in one embodiment, and in another embodiment the predetermined period of time is more than 0.5 seconds and less than 20 seconds. The predetermined period of time can be more than 0.5 seconds and less than 5 seconds in one embodiment. In one embodiment, the RFID transponder can include a dipole antenna coupled to the RF transceiver, and this dipole antenna can be configured to receive an RF signal from a reader and to backscatter a responsive RF signal to the reader. In one embodiment, the first reference voltage (which is coupled to the switch) can be variable in order to vary the period of time for which the state of a flag is to be held high. In another embodiment, the predetermined reference voltage can be variable in order to vary the predetermined period of time for which the state of the flag is to persist. In yet another embodiment, both the first reference voltage and the predetermined reference voltage can be variable in order to vary the predetermined period of time. The flag state to be held for a selected time can be a timeout interval, marking the time since the flag was set in an inventory, since a password attempt was made, etc. The time to expiration of the flag may also depend on an externally provided voltage or stimulus such as incident light.

In one embodiment, multiple persistent nodes may be implemented for various functions of the tag, including the Session flags of ISO 18000-6c or the SL flag of that same protocol. In one embodiment, the flags may only discharge during periods when no power is supplied to the tag, and refreshed when power becomes available only if they have not already expired. In one embodiment, there may be nodes which time the timeout period for security protocols which require an interval of time to pass before another password attempt or other security procedure is allowed.

In one embodiment, the RFID transponder can include an optional discharge circuit which is coupled to the processing logic and which is coupled to the charge storage node in order to selectively discharge the charge storage node in response to a signal from the processing logic.

In one embodiment, the discharging of the capacitors in the capacitive circuit of the state storage device, can be dominated by the tunneling current when the state storage circuit's temperature is above about 40° C.

The above summary does not include an exhaustive list of all aspects of the present invention. It is contemplated that the invention includes all systems and methods that can be practiced from all suitable combinations of the various aspects summarized above, and also those disclosed in the Detailed Description below.

BRIEF DESCRIPTION OF THE DRAWINGS

The present invention is illustrated by way of example and not limitation in the figures of the accompanying drawings in which like references indicate similar elements.

FIG. 5C is an example of a reference voltage generator which can provide different reference voltages.

DETAILED DESCRIPTION

Figure 1:
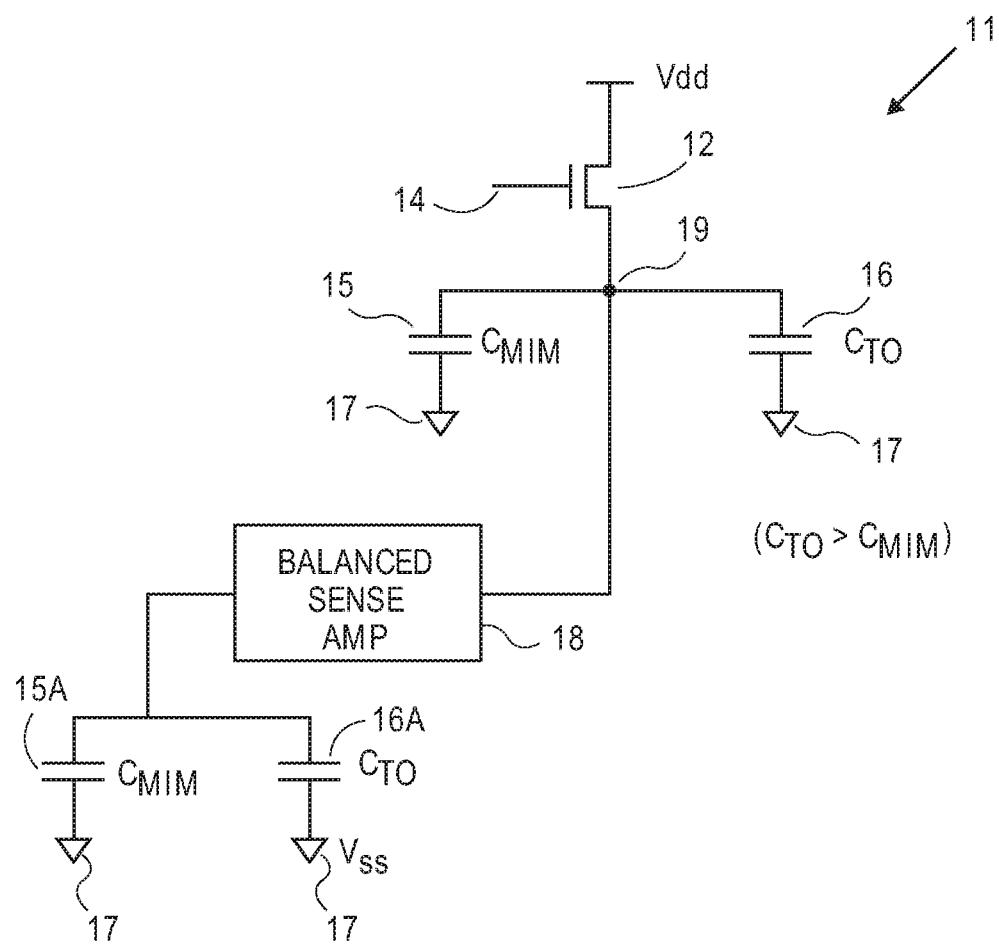
FIG. 1 shows an example of a state storage device in the prior art.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment. The processes depicted in the figures that follow are performed by processing logic that comprises hardware (e.g. circuitry, dedicated logic, etc.), software, or a combination of both. The processing logic may consist of a finite state machine, or several interconnected finite state machines. Although the processes are described below in terms of some sequential operations, it should be appreciated that some of the operations described may be performed in a different order. Moreover, some operations may be performed in parallel rather than sequentially.

The state storage device of the present invention can be used to store data such as a bit in a volatile memory cell, and the stored bit can be used as a flag as is known in the art that can be retained over short periods of time when the RFID transponder or tag loses power, such as when a passive RFID transponder no longer receives a signal from a reader which provides power to the transponder. In some embodiments, the state can be passively stored on one or more capacitors as is described herein. When the tag or transponder loses power, the capacitor can retain its charge over a period of time as it slowly discharges. Thus, when the reader provides power again, the tag can recognize its storage state or flag and operate accordingly based upon the protocol being used by the tag, such as the EPC global protocol referred to herein or the ISO/IEC 18000-6 specification referred to above. In some embodiments, the state storage device can be set to provide a storage time which is a predetermined or otherwise known time selected to avoid missing tags in subsequent interrogation rounds due to a missed command to reset the state storage bit or for other reasons to provide a known time. This known time can provide a known upper limit on the storage duration of the bit stored in a state storage device. As is known in the art, a limited retention time in the state storage device helps prevent tags that have already been identified from entering the protocol identification process or other protocol repeat process again, while allowing tags which have not been inventoried for a period of time to re-enter the protocol identification process, and thereby increases throughput in the process of inventorying or counting or otherwise identifying RFID tags or transponders. The time period can start when the flag is set, and then a process can check the status of the flag at a later point in time, or the discharge may only start when an interval when the tag has no power from the reader, and be considered timed out only if it discharges below the predetermined reference voltage before power is again available.

Figure 2:
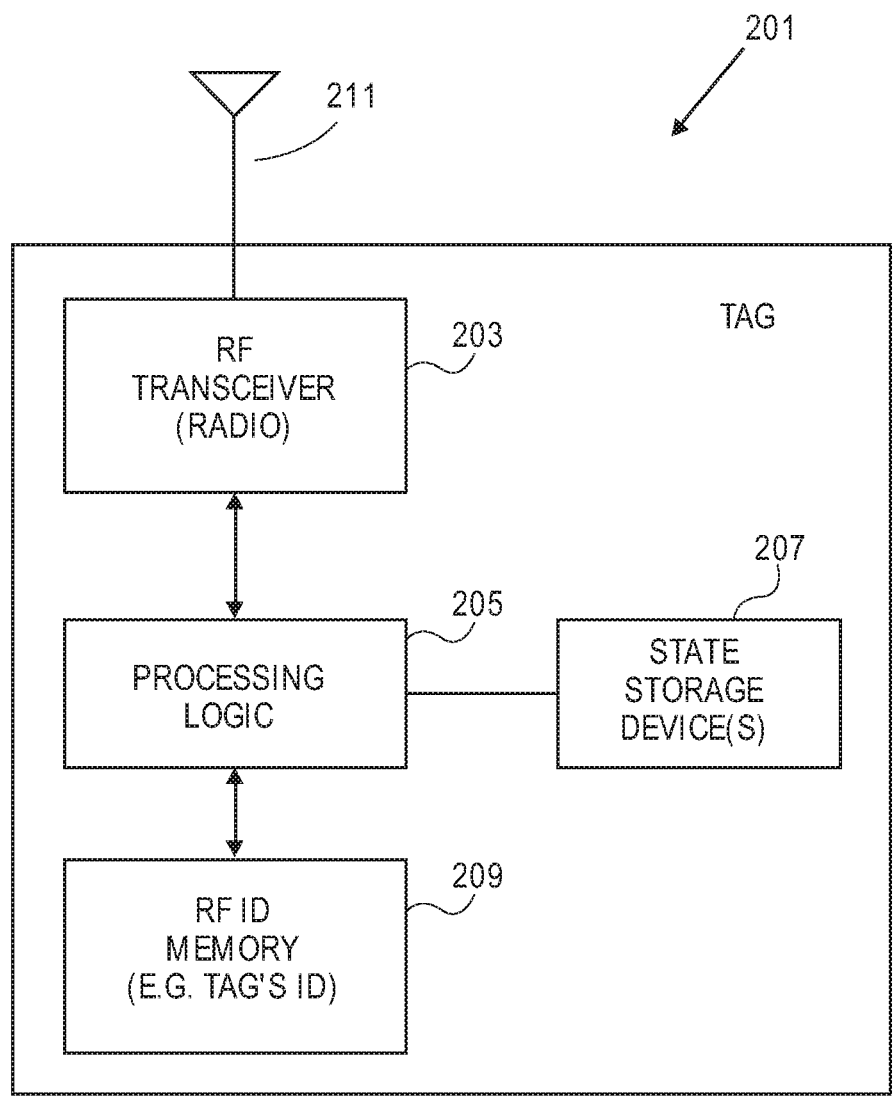
FIG. 2 shows a block diagram of an RFID transponder according to one embodiment of the present invention.

FIG. 2 provides a block level representation of an RFID transponder according to one embodiment of the present invention. The tag or transponder 201 includes one or more antennas, such as antenna 211 which, in one embodiment, can be a dipole antenna, a t-match meandered antenna with end loading, or a loop antenna or other antennas known in the art. The antenna 211 is coupled to an RF transceiver 203 which provides a radio circuit including both a transmitter and a receiver. The receiver receives signals from an RFID reader, such as the RFID reader shown in FIG. 3 and the transmitter of the transceiver 203 transmits signals to an RFID reader, such as the RFID reader shown in FIG. 3. The RF transceiver 203 is coupled to processing logic 205 which can be implemented in a variety of different ways, including a microcontroller or a programmable logic device, or an ASIC control circuitry, etc. Processing logic 205 is coupled to the RFID memory 209 and is coupled to the state storage device 207. Tag 201 can include one or more state storage devices 207 to store one or more states, each having at least one bit for a particular state. In one embodiment, the tag 201 can include four state storage devices 207, each receiving a separate control signal to control its respective switch, the control signals being provided by processing logic 205 as is known in the art. Examples of circuits which can implement the state storage devices 207 are provided in FIGS. 4A, 4B, and 5A and are further described below. RFID memory 209 can be non-volatile memory such as a mask read-only memory (ROM), electrically erasable (EE) programmable read only memory, or flash memory or other non-volatile memory which can store information for the transponder, such as the tag's identification number or identification code and other information as is known in the art. Processing logic 205 can retrieve the data from RFID memory 209 according to the various protocols under which the tag can operate and can transmit those identification values to a reader through the RF transceiver 203 as is known in the art.

Figure 3:
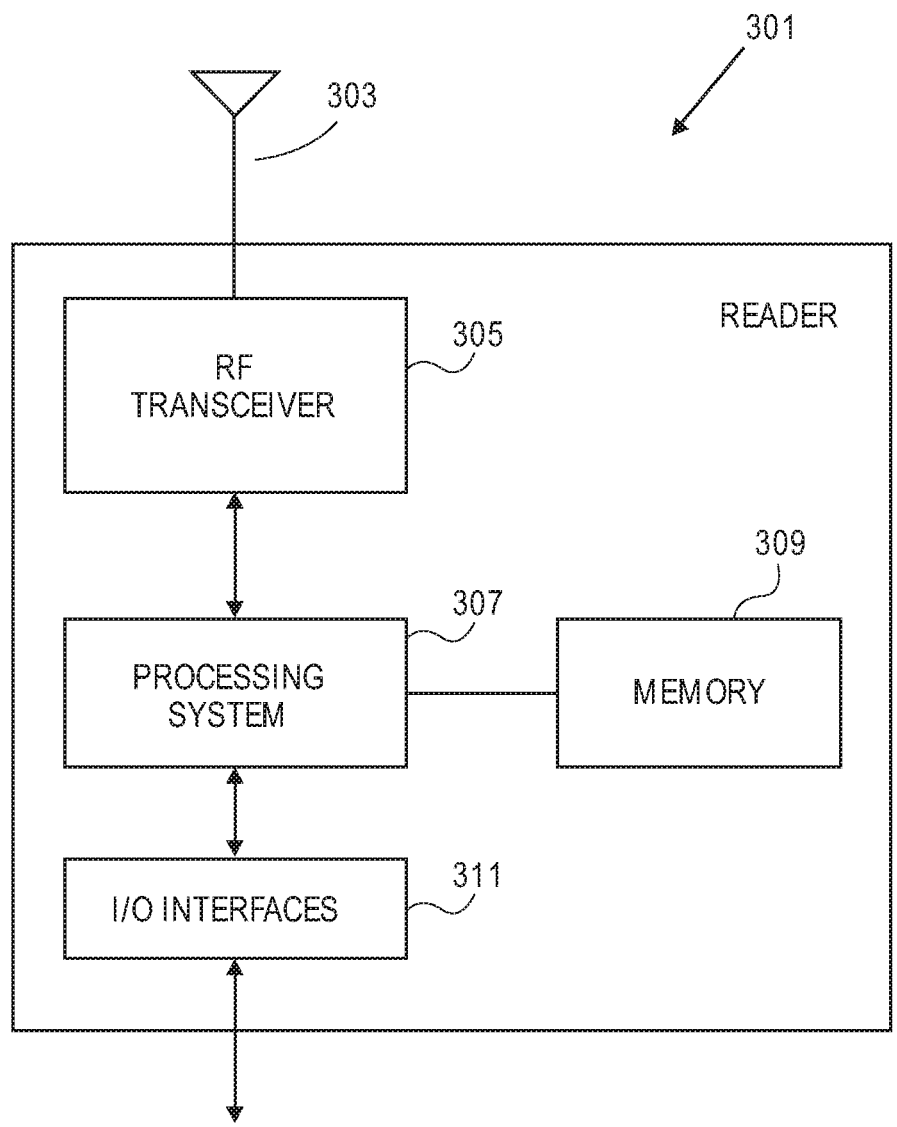
FIG. 3 shows an example of an RFID reader which can be used with an RFID transponder described herein.

FIG. 3 shows an example of an RFID reader which can operate with any one of the RFID transponders described herein. For example, the reader shown in FIG. 3 can operate with the tag 201 which can include the state storage device 207 implemented as shown in any one of FIGS. 4A, 4B, and 5A. Reader 301 can include one or more antennas, such as antenna 303, which is coupled to an RF transceiver 305 as is known in the art. The RF transceiver 305 can be coupled to a processing system 307 which in turn is coupled to memory 309 and to input/output interfaces 311 as is known in the art. The input/output interfaces 311 can provide an interface to other systems such as computers or other devices which are coupled to the reader 301 in order to receive data from the tags queried by the reader 301. The RF transceiver 305 can operate in conjunction with processing system 307 as is known in the art to implement any one of the known protocols for communicating with RFID tags such as the EPC global protocol referred to above or the ISO/IEC protocol referred to above.

Figure 4A:
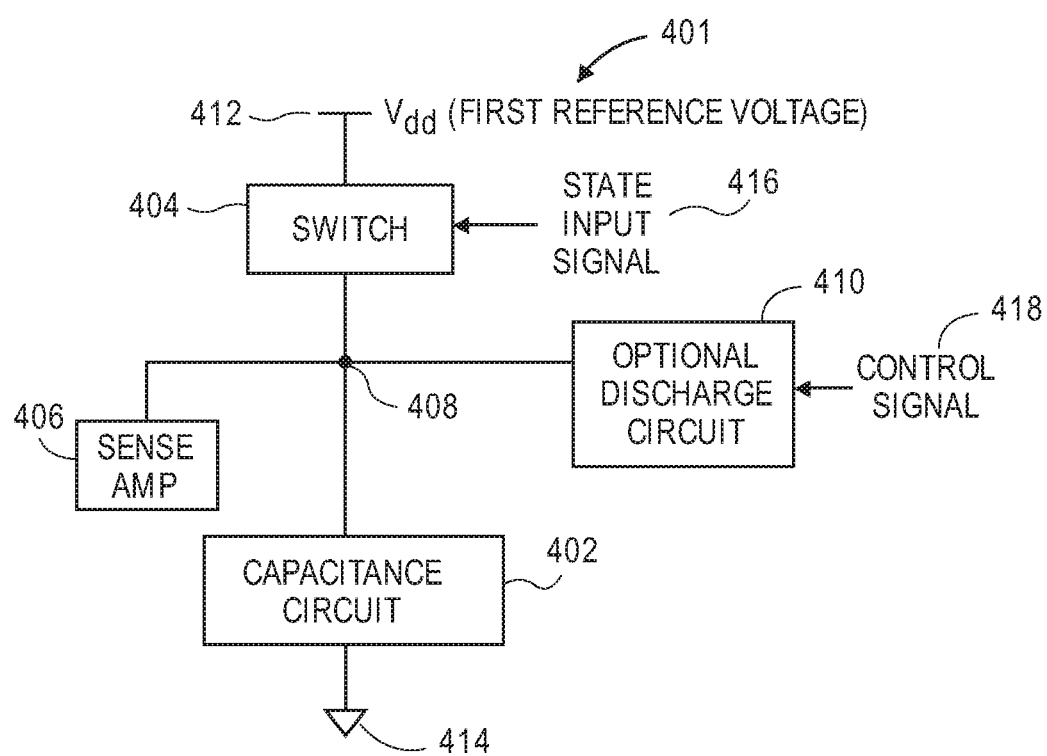
FIG. 4A is a block diagram schematic of a state storage device for use in an RFID transponder according to one embodiment of the present invention.

FIG. 4A shows a block diagram of a state storage device according to one embodiment of the present invention. The state storage device can include a switch 404 which receives a first reference voltage 412 which can be, in one embodiment, a power supply voltage such as $V_{dd}$ or a voltage derived from a voltage source. In one embodiment, the first reference voltage 412 acts as a charging node to charge the capacitance circuit. In one embodiment, the first reference voltage 412 acts as a charging node to charge the capacitance circuit and at different point in time, the first reference voltage 412 acts as a discharging node to discharge the capacitance circuit. The switch 404 in the state storage device 401 includes an input to receive a state input signal 416 which is used to control the state of the bit or flag stored by the state storage device 401 as is known in the art. The switch 404 in the state storage device 401 is coupled to the node 408, and node 408 is also coupled to sense amp 406 and to an optional discharge circuit 410 which is controlled by a control signal 418 which can be provided by processing logic to selectively discharge the capacitance circuit 402 in response to a command from the control signal 418. The node 408 can be considered a charge storage node. The state input signal 416 can be provided by processing logic, such as processing logic 205 as is known in the art, and processing logic 205 can also provide the control signal 418 to the optional discharge circuit 410 to cause the capacitance circuit 402 to discharge. Capacitance circuit 402 is coupled to node 408 and is also coupled to a second reference voltage 414 which can be a power supply voltage such as $V_{ss}$ in one embodiment. The capacitance circuit 402 can include one or more capacitors, each implemented and disposed at least partially in a substrate of a semiconductor integrated circuit. In one embodiment the capacitance circuit can include both a thick oxide capacitor and a thin oxide capacitor coupled together in parallel. In one embodiment, the capacitance circuit can include a capacitor disposed in either the substrate or above the substrate as a metal-insulator-metal capacitor. In one embodiment, the tunneling device can include a thin dielectric which is not an oxide, such as silicon nitride, or other dielectrics.

State storage device 401 can be operated in a manner which is consistent with the protocols known in the art, such as the EPC global protocol or the ISO/IEC protocol referred to above. For example, the processing logic can cause the switch 404 to charge node 408 to within a threshold voltage of the first reference voltage 412 which in turn will charge the capacitors within the capacitance circuit 402. Then the processing logic can turn off the state input signal 416 to shut off the switch and to thereby isolate the node 408 from the first reference voltage 412 to allow the capacitors within the capacitance circuit 412 to retain a charge even if power is lost in the tag (such as when the RFID reader stops transmitting a signal to the passive RFID tag which contains the state storage device 401). The voltage node 408 discharges over time after a loss of power and at a later point in time when the tag is receiving power, the sense amp 406 can determine the state of node 408 to determine whether or not the capacitance circuit has been discharged and thereby determine the state of the flag or bit stored by the state storage device 401.

Figure 4B:
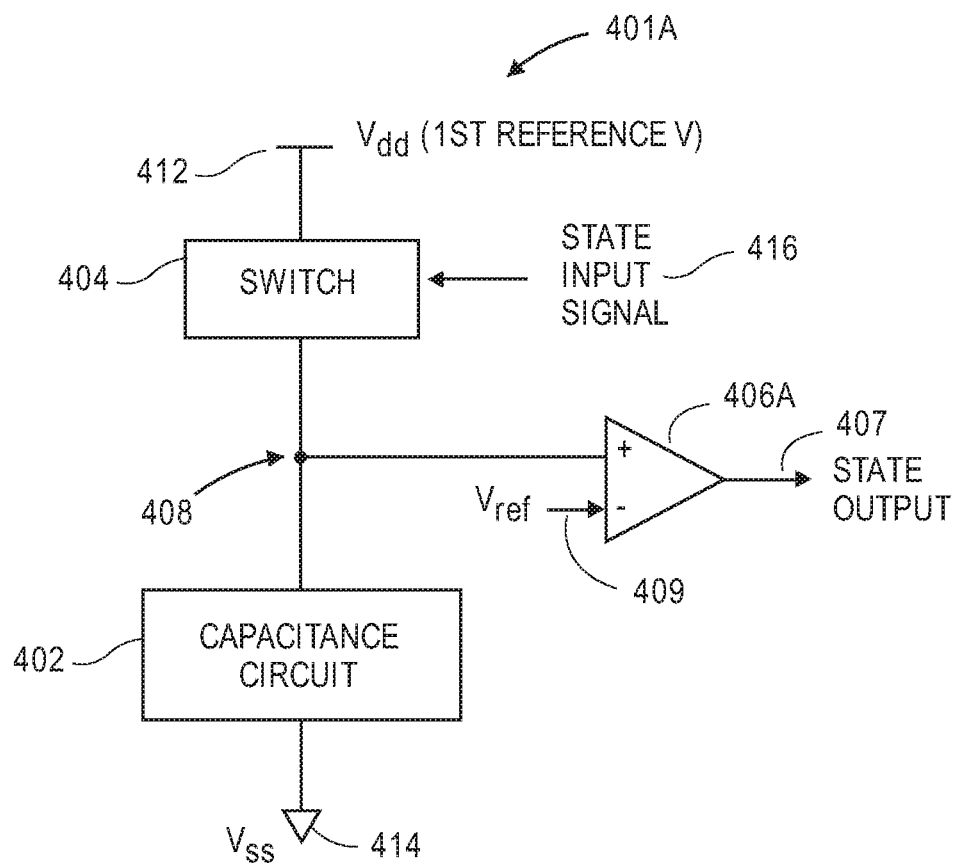
FIG. 4B is a block diagram schematic of a state storage device which can be used in an RFID transponder according to an embodiment of the present invention.

FIG. 4B shows an example of an implementation of the circuit shown in FIG. 4A in which the sense amp 406 is implemented as a differential sensing amplifier which includes two inputs, one of which receives the voltage from node 408 and is coupled to node 408 as shown in FIG. 4B, and the other of which receives a reference voltage 409. The differential sense amp 406A provides an output 407 which indicates the state of the state storage device 401A based upon the comparison between the voltage at node 408 and the reference voltage 409 which can be a predetermined reference voltage as in the examples provided below.

Figure 5A:
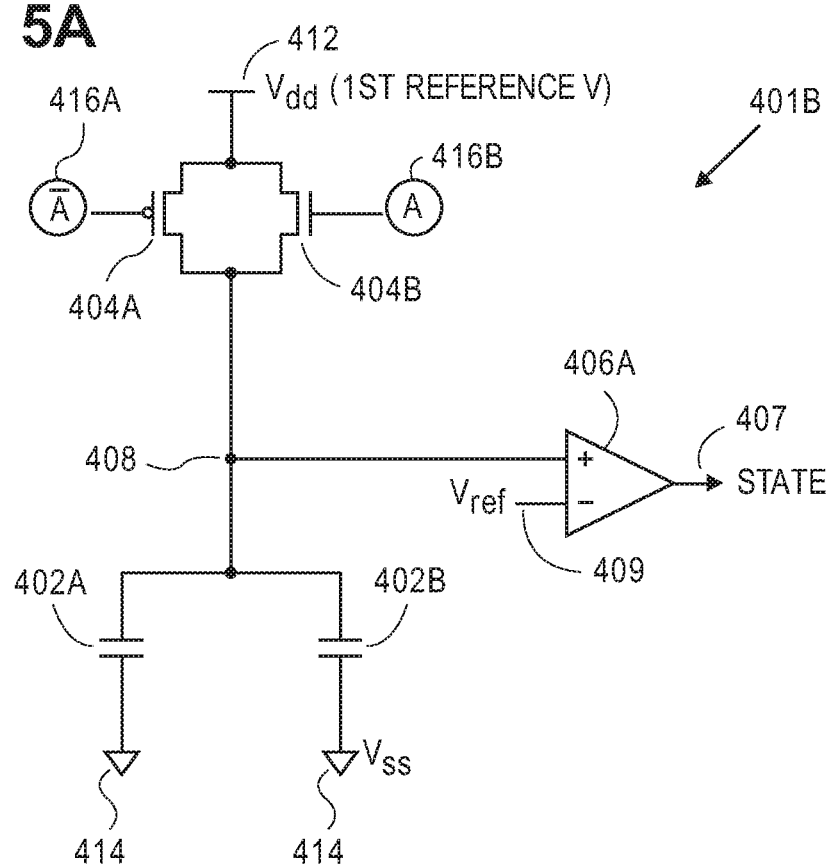
FIG. 5A is a circuit schematic showing an example of a state storage device according to one embodiment of the present invention which can be used in an RFID transponder.

FIG. 5A shows a circuit schematic of a state storage device 401B which is similar to state storage device 401A of FIG. 4B. Switch 404 has been implemented as a complementary set of pass gates which include an n-channel FET 404B and a p-channel FET 404A coupled in parallel between a first reference voltage 412 and the node 408. The gate of FET 404B receives state input signal 416B, and the gate of FET 404A receives state input signal 416A which is an inverted version of state input signal 416B. Input signals 416A and 416B are operated as is known in the prior art to control the switch in order to selectively charge node 408 and then to selectively turn off the transistors 404A and 404B to isolate node 408 from the first reference voltage 412 so that the node 408 is isolated from the first reference voltage 412 should power be lost by the tag containing the state storage device 401B. In one embodiment, FETs 404A and 404B may be implemented as long channel MOSFETs in order to reduce significantly the leakage current through the FET to make the leakage current negligible. While not shown in FIG. 5A, it will be understood that the circuit shown in FIG. 5A can optionally include a discharge circuit, such as discharge circuit 410 which is coupled to the node 408 and which is controlled by processing logic as described herein.

Figure 7:
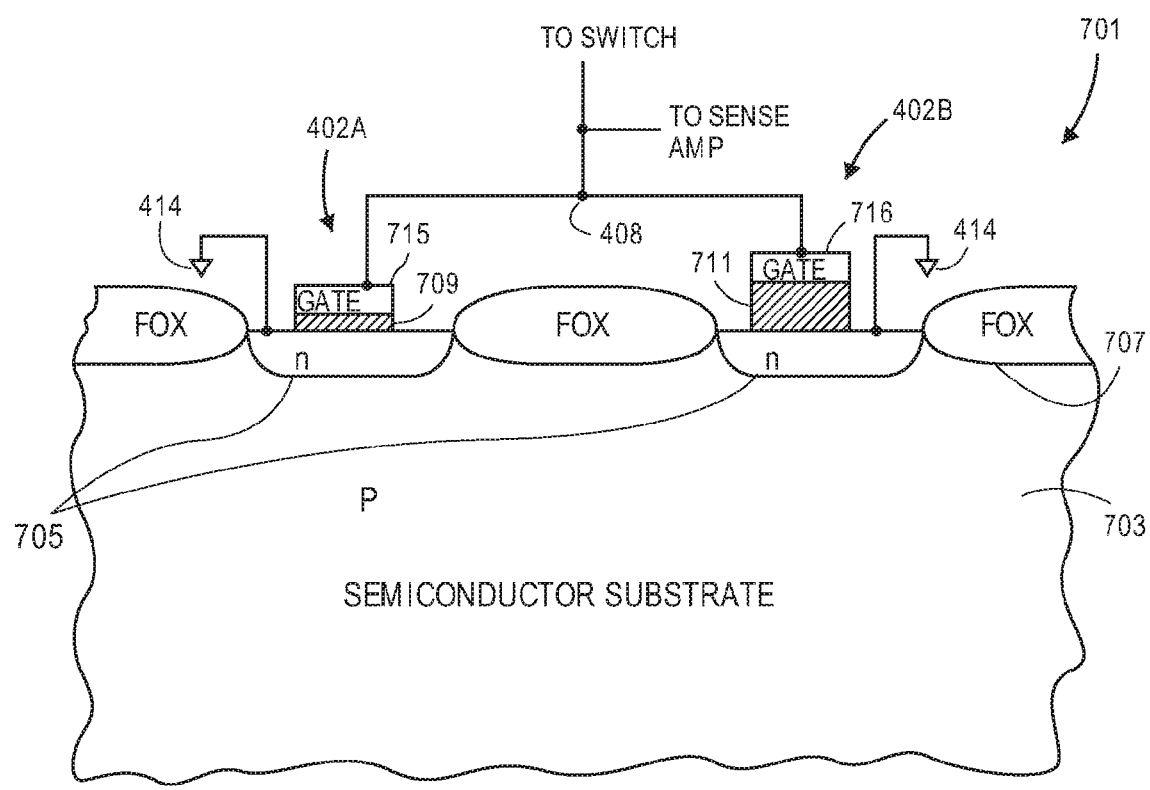
FIG. 7 shows a cross-sectional view through a semiconductor substrate, wherein the view shows two capacitors disposed at least partially in that substrate according to one embodiment of the present invention.

State storage device 401B also includes a differential sense amp or sensing circuit 406A which receives the voltage at node 408 at one input of the differential sense amp 406A and which receives another reference voltage which is a predetermined reference voltage in one embodiment shown as reference voltage 409. In one embodiment, reference voltage 409 does not equal the reference voltage 414 and is greater than the fully discharged voltage of the capacitance circuit which includes the capacitors 402A and 402B which are coupled in parallel between node 408 and the reference voltage 414 which may be ground or $V_{ss}$ in one embodiment. Capacitors 402A and 402B represent one example of capacitance circuit 402 in FIG. 4B, and it will be appreciated that the capacitance circuit can be implemented by a combination of one or more capacitors in one embodiment. The capacitors may be implemented as metal-insulator-metal capacitors or as capacitors in the same substrate as the thin oxide capacitor. In other embodiments, both the tunneling device and the charge storage capacitors can be implemented as metal-insulator-metal capacitors. FIG. 7 shows a cross-sectional view of a semiconductor substrate which includes capacitor 402B and tunneling device 402A which is one implementation of the capacitance circuit 402 when it contains both a charge storage capacitor and a tunneling device such as a thin oxide capacitor. As shown in FIG. 7, the tunneling device 402A includes a thin gate oxide 709 which separates the gate electrode 715 from the n-doped substrate region 705 which is a doped region within the P semiconductor substrate 703. Optional field oxide regions 707 isolate the devices, such as capacitors 402A and 402B. The charge storage capacitor 402B includes a gate 716 which is isolated from the n-region 707 by a thick gate oxide 711. The n-regions 705 are coupled to $V_{ss}$ or reference voltage 414 as shown in FIG. 7 and the gates 715 and 716 are coupled to the node 408 as shown in FIG. 7.

Figure 5B:
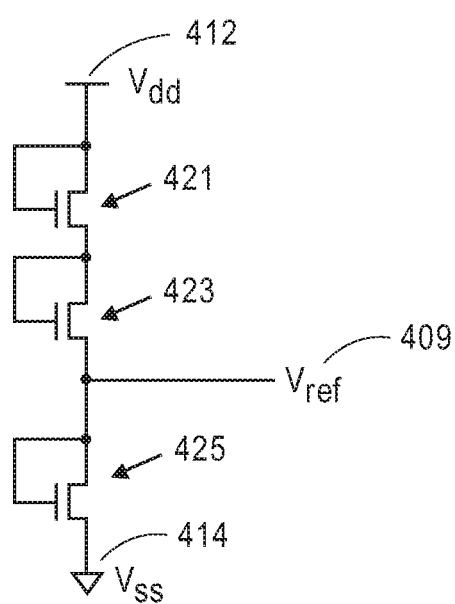
FIG. 5B is an example of a reference voltage generator which can provide a reference voltage, such as $V_{ref}$ according to one embodiment of the present invention.
Figure 6:
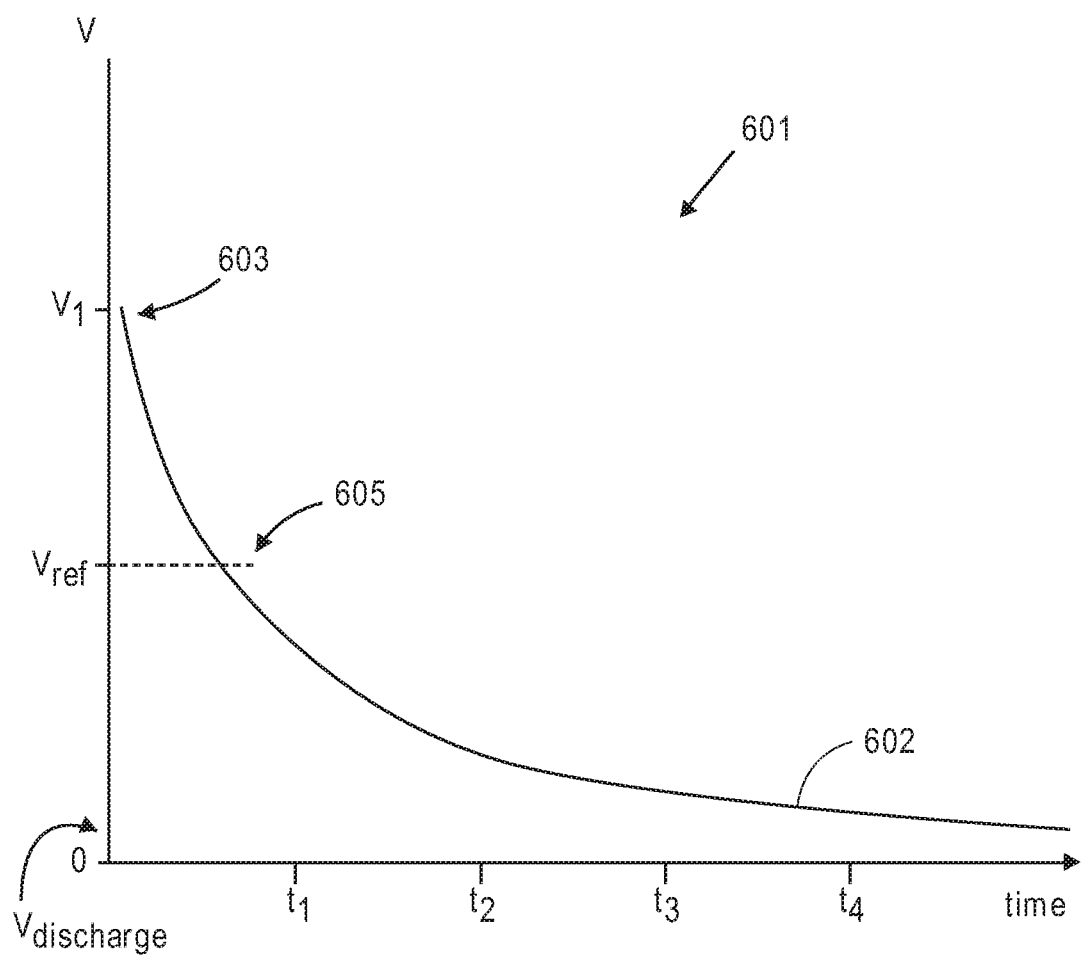
FIG. 6 is a voltage vs. time graph showing the discharging of a charge storage node over time and showing the relationship of a predetermined reference voltage relative to the discharge curve in the graph of FIG. 6.

FIG. 5B provides an example of a reference voltage generator which can generate a predetermined reference voltage such as the $V_{ref}$ 409 which is provided as an input to the differential sense amplifier 406A shown in FIG. 5A. The reference voltage generator shown in FIG. 5B can include three MOSFETs which are shown as n-channel devices 421, 423, and 425, coupled in series as shown in FIG. 5B between reference voltage 412 and reference voltage 414. The MOSFETs are diode-coupled devices in that the gate of each MOSFET is coupled to the drain of each MOSFET as shown in FIG. 5B. It will be appreciated that the reference voltage 409 can be varied by using different reference voltage generators in the manner shown in FIG. 5B with different numbers of MOSFETs in series and by using different output points to obtain different reference voltages as an output from each of the different reference voltage generators. A multiplexer can receive those different reference voltages and then the processing logic can select between those different reference voltages to provide a particular reference voltage to the sense amplifier 406A. In this manner, the processing logic can select different reference voltages which, as explained below, will result in different predetermined periods of time for the state storage device as will be explained in conjunction with FIG. 6. FIG. 5C shows an example of a reference voltage generator that can generate different reference voltages that can be applied as an input to the sense amp 406A and be compared, by the sense amp 406A, to the voltage on node 408. The reference voltage generator in FIG. 5C includes a chain of series connected n-channel MOSFETs 431, 433, 435, 437, 439, and 441, with the gate of each of these MOSFETs connected, in a diode coupled manner, to the drain of each MOSFET. There are, in this embodiment, three different output taps which drive a multiplexer 443; other embodiments can use fewer or more MOSFETs with fewer or more output tags. Each output tag provides a different $V_{ref}$ which provides a different time period for the persistent node. The control signal 445 is controlled by the processing logic (e.g. 205) in the RFID transponder to select the desired time period; thus, the position of $V_{ref}$ in FIG. 6 is varied to provide different time periods. The output of multiplexer 443 is inputted to the sense amp 406A.

FIG. 6 shows a graph of the discharge of capacitance circuit 402 over time after it has been charged to a value, such as $V_1$ shown as 603 in the graph 601. The capacitance circuit discharges as shown by the curve 602 in the graph 601 over time. The $V_{ref}$ 605 represents the voltage or predetermined reference voltage 409 shown in FIG. 5A. Prior art circuits required a relatively higher current than the tunneling current of this invention due to the difficulty of maintaining a very low bias, and thus a low current, through an FET. Prior art circuits therefore required relatively larger charge storage, and a detector capable of detecting a very low discharge point. Prior art implementations of sense circuits for state storage devices in RFID transponders compared node 408 to a fully discharged capacitance circuit; this value is shown as $V_{discharge}$ in FIG. 6. It can be seen that $V_{ref}$ 605 which represents the reference voltage 409 shown in FIG. 5A is significantly higher than the $V_{discharge}$ voltage. This allows the differential sense amp 406A to more quickly and accurately decide the state of the node 408. Moreover, by varying the reference voltage 409 as described herein, different predetermined periods of time for the state storage device can be provided in an accurate manner using the capacitor which controls the discharge over time to an accurate degree independently or substantially independently of temperature and semiconductor process manufacturing variations.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An electronic one shot timer, the one shot timer comprising:
   a charge storage node for storing a charge for a predetermined time;
   a charging node coupled to the charge storage node to provide a charging voltage;
   a switch between the charge storage node and the charging node;
   a comparison circuit coupled to the charge storage node;
   a voltage reference node coupled to the comparison circuit to provide a reference voltage, the comparison circuit comparing the charge storage node voltage to the reference voltage;
   a capacitance circuit coupled to the charge storage node, the capacitance circuit comprising a first capacitor and a second capacitor coupled to the first capacitor, wherein the first capacitor is smaller than the second capacitor, and wherein the first capacitor acts as a tunneling device that provides a tunneling current that represents the majority of the discharge current of the charge storage node, and wherein the charge storage node discharges from the charge storage node voltage which is about the charging voltage to a second voltage below the reference voltage.

2. The electronic one shot timer of claim 1, wherein the first capacitor is coupled in parallel with the second capacitor.

3. The electronic one shot timer of claim 2, wherein the first capacitor comprises an oxide that is thinner than an oxide of the second capacitor.

4. The electronic one shot timer of claim 3, where the oxide thickness of the first capacitor is between 10 nanometers and 50 nanometers.

5. The electronic one shot timer of claim 1, wherein a leakage current through the switch is substantially less than the tunneling current.

6. The electronic one shot timer of claim 1, wherein the comparison circuit comprises a differential amplifier.

7. The electronic one shot timer of claim 1, wherein the predetermined time is independent of a temperature that is in a range from 25 degrees C. to +40 degrees C. or greater.

8. The electronic one shot timer of claim 1, wherein at least one of the charge voltage and the reference voltage is variable to set the predetermined time.

9. The electronic one shot timer of claim 1, wherein the predetermined time is controlled by the tunneling current.

* * * * *